United States Patent
Johnson et al.

(10) Patent No.: US 7,785,970 B2
(45) Date of Patent: Aug. 31, 2010

(54) METHOD OF FORMING SOURCE AND DRAIN REGIONS UTILIZING DUAL CAPPING LAYERS AND SPLIT THERMAL PROCESSES

(75) Inventors: Frank Scott Johnson, Richardson, TX (US); Shaofeng Yu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 278 days.

(21) Appl. No.: 11/841,269

(22) Filed: Aug. 20, 2007

(65) Prior Publication Data
US 2009/0053865 A1   Feb. 26, 2009

(51) Int. Cl.
*H01L 21/8238* (2006.01)
(52) U.S. Cl. ............... 438/275; 438/199; 257/E21.454
(58) Field of Classification Search .......... 438/199, 438/229, 230, 275, 299, 303, 308; 257/E21.4, 257/E21.454
See application file for complete search history.

(56) References Cited

U.S. PATENT DOCUMENTS

| | | | |
|---|---|---|---|
| 5,946,562 A | 8/1999 | Kuo | |
| 6,689,671 B1 | 2/2004 | Yu et al. | |
| 7,211,458 B2 | 5/2007 | Ozturk et | |
| 2005/0199958 A1* | 9/2005 | Chen et al. | 257/368 |
| 2008/0023771 A1* | 1/2008 | Romero et al. | 257/369 |
| 2008/0057636 A1* | 3/2008 | Lindsay et al. | 438/199 |

* cited by examiner

*Primary Examiner*—Thanhha Pham
(74) *Attorney, Agent, or Firm*—Warren L. Franz; Wade J. Brady, III; Frederick J. Telecky, Jr.

(57) ABSTRACT

Source and drain regions are formed in a first-type semiconductor device. Then, a high tensile stress capping layer is formed over the source and drain regions. A thermal process is then performed to re-crystallize the source and drain regions and to introduce tensile strain into the source and drain regions of the first-type semiconductor device. Afterwards, source and drain regions are formed in a second-type semiconductor device. Then, a high compressive stress capping layer is formed over the source and drain regions of the second-type semiconductor device. A thermal process is performed to re-crystallize the source and drain regions and to introduce compressive strain into the source and drain regions of the second-type semiconductor device.

28 Claims, 10 Drawing Sheets

METHOD OF FORMING SOURCE AND DRAIN REGIONS UTILIZING DUAL CAPPING LAYERS AND SPLIT THERMAL PROCESSES

FIELD

This invention relates generally to semiconductor fabrication.

BACKGROUND

Currently, a polysilicon ("poly") cap layer with high tensile stress is utilized to improve the performance of NMOS semiconductor devices. The poly cap layer is deposited over the NMOS device after a source and drain ion implantation and prior to a source and drain anneal. As the source and drain are annealed, the re-crystallization retains the stress of the poly cap layer formed over the source and drain. The tensile strain introduced into the source and drain improves charge carrier mobility in the NMOS device.

Typically, the poly cap layer is also formed over other semiconductor devices contained in the wafer, such as PMOS devices. The source and drain of both the PMOS and NMOS devices are subjected to an anneal, simultaneously, in order to re-crystallize the silicon of both the PMOS and NMOS devices. However, the high tensile stress of the poly cap layer does not improve the performance of the PMOS device. In fact, the PMOS device's performance may be degraded by the presence of the poly cap layer during the source and drain anneal. As such, processes are needed that allow tensile stain to be introduced into an NMOS device without adversely affecting a PMOS device.

SUMMARY OF THE INVENTION

An embodiment of the present disclosure is directed to a method of fabricating a semiconductor device. The method includes forming a source region and a drain region in at least one NMOS semiconductor region; forming a tensile stress capping layer over the at least one NMOS semiconductor region and at least one PMOS semiconductor region; performing a thermal process to re-crystallize the source region and drain region of the NMOS semiconductor region and to introduce tensile strain to the source region and drain region of the NMOS semiconductor region; and forming a source region and drain region in the at least one PMOS semiconductor region.

Another embodiment is directed to a method of fabricating a semiconductor device. The method includes forming a source region and a drain region in at least one PMOS semiconductor region; forming a compressive stress capping layer over the at least one PMOS semiconductor region and at least one NMOS semiconductor region; performing a thermal process to re-crystallize the source region and drain region of the PMOS semiconductor region and to introduce compressive strain to the source region and drain region of the PMOS semiconductor region; and forming a source region and drain region in the at least one NMOS semiconductor region.

Another embodiment is directed to a method of fabricating a semiconductor device. The method includes forming a source region and a drain region in at least one a first-type semiconductor region; forming a tensile stress capping layer over the at least one first-type semiconductor region and at least one second-type semiconductor region; performing a thermal process to re-crystallize the source region and drain region of the first-type semiconductor region and to introduce tensile strain to the source region and drain region of the first-type semiconductor region; and forming a source region and drain region in the at least one second-type semiconductor region.

Another embodiment of the present disclosure is directed to a method of fabricating a semiconductor device. The method includes forming a source region and a drain region in at least one NMOS semiconductor region; forming a tensile stress capping layer over the at least one NMOS semiconductor region and at least one PMOS semiconductor region; performing a thermal process to re-crystallize the source region and drain region of the NMOS semiconductor region and to introduce tensile strain to the source region and drain region of the NMOS semiconductor region; removing portions of the tensile stress capping layer to form sidewalls on at least one NMOS gate of the at least one NMOS semiconductor region and at least one PMOS gate of the at least one PMOS semiconductor region; and forming a source region and drain region in the at least one PMOS semiconductor region.

Another embodiment is directed to a method of fabricating a semiconductor device. The method includes forming a source region and a drain region in at least one PMOS semiconductor region; forming a compressive stress capping layer over the at least one PMOS semiconductor region and at least one NMOS semiconductor region; performing a thermal process to re-crystallize the source region and drain region of the PMOS semiconductor region and to introduce compressive strain to the source region and drain region of the PMOS semiconductor region; removing portions of the compressive stress capping layer to form sidewalls on at least one NMOS gate of the at least one NMOS semiconductor region and at least one PMOS gate of the at least one PMOS semiconductor region; and forming a source region and drain region in the at least one NMOS semiconductor region.

Another embodiment is directed to a method of fabricating a semiconductor device. The method includes forming a source region and a drain region in at least one first-type semiconductor region; forming a tensile stress capping layer over the at least one first-type semiconductor region and at least one second-type semiconductor region; performing a thermal process to re-crystallize the source region and drain region of the first-type semiconductor region and to introduce tensile strain to the source region and drain region of the first-type semiconductor region; removing portions of the tensile stress capping layer to form sidewalls on at least one gate of the at least one first-type semiconductor region and at least one gate of the at least one second-type semiconductor region; and forming a source region and drain region in the at least one second-type semiconductor region.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the disclosure and together with the description, serve to explain the principles of the embodiments.

DESCRIPTION OF THE EMBODIMENTS

Embodiments of the present disclosure are directed to a method of forming source and drain regions utilizing dual capping layers and split thermal processes. In the method, source and drain regions are formed in a first-type semiconductor device. Then, a high tensile stress capping layer is formed over the source and drain regions. A thermal process is then performed to re-crystallize the source and drain regions and to introduce tensile strain into the source and drain regions of the first-type semiconductor device.

Afterwards, source and drain regions are formed in a second-type semiconductor device. Then, a high compressive stress capping layer is formed over the source and drain regions of the second-type semiconductor device. A thermal process is performed to re-crystallize the source and drain regions and to introduce compressive strain into the source and drain regions of the second-type semiconductor device. Additionally, the capping layers can be utilized to form sidewalls on gates of the first-type and second-type semiconductor devices.

By utilizing separate capping layers and thermal processes, different-type semiconductor devices can be individually optimized without adversely affecting the devices during processing.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
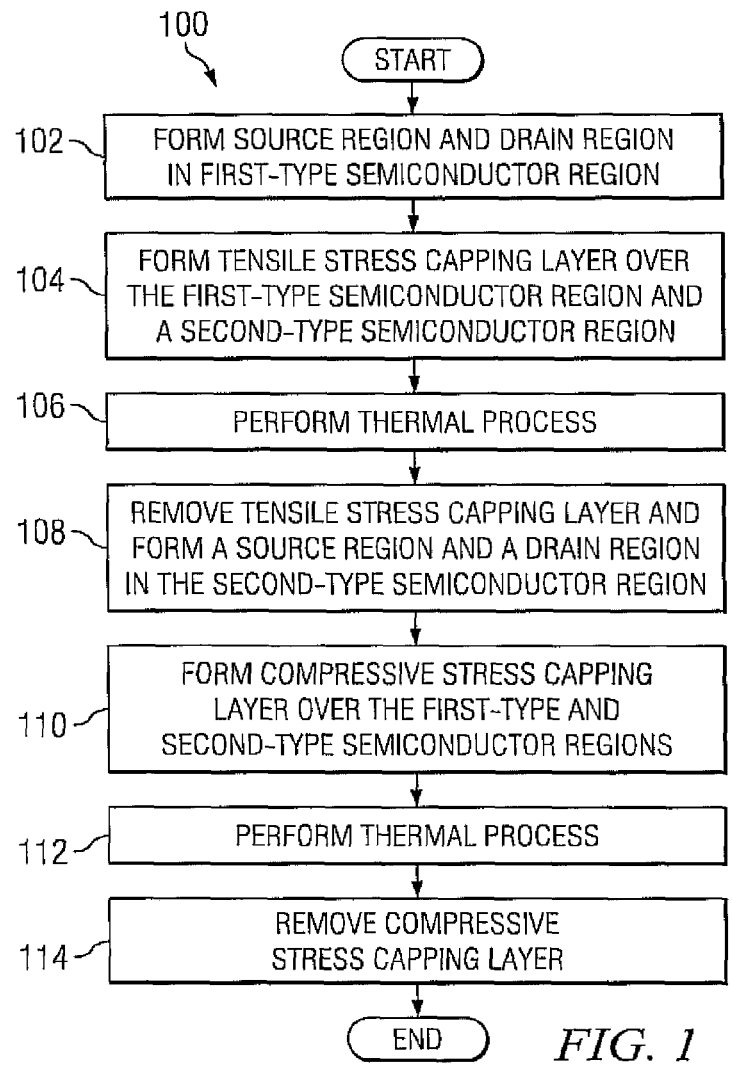
FIG. 1 is a flow diagram illustrating a method for forming source and drain regions consistent with embodiments of the present disclosure.

FIG. 1 is a flow diagram illustrating a method 100 for forming source and drain regions in different-type semiconductor regions. Method 100 begins with forming source and drain regions in a first-type semiconductor region (stage 102). The source and drain regions may be formed by implanting ions in the first-type semiconductor region. As such, amorphization occurs in a gate and the source and drain regions. The first-type semiconductor region can be any type of partially completed, well-known semiconductor device that was formed using any type of well-known technique. For example, first-type semiconductor region can be a MOSFET, such as an NMOS, PMOS, or other suitable semiconductor device. The first-type semiconductor region can include conventional features such as a gate with sidewalls formed over a well region.

The source and drain region can be formed by an ion implantation. The ion implantation causes amorphization in the gate and source and drain region. The ion implantation may be performed using any suitable techniques available in semiconductor processing for ion implantation. For example, boron or other suitable P-type dopant may be implanted during the ion implantation process to form the source region and the drain region. Likewise, arsenic, phosphorous, antimony, or other suitable N-type dopant may be implanted.

Next, a tensile stress capping layer is formed over the first-type semiconductor region and a second-type semiconductor region (stage 104). The tensile stress capping layer can be any type of suitable tensile stress layer. For example, the tensile stress capping layer can be one or more nitride layers, one or more oxide layers, combination thereof and the like.

The second-type semiconductor region can be any type of partially completed, well-known semiconductor device that was formed using any type of well-known technique, but different than the first-type semiconductor device. For example, the second-type semiconductor region can be a MOSFET, such as an NMOS, PMOS, or other suitable semiconductor device. The second-type semiconductor region can include conventional features such as a gate with sidewalls formed over a well region. During forming the source and drain regions for the first-type semiconductor region, the second-type semiconductor region is masked to prevent the formation of source and drain regions in the second-type semiconductor device.

After forming the tensile stress capping layer, a thermal process is performed (stage 106). The thermal process re-crystallizes the source and drain regions of the first-type semiconductor region. Additionally, the thermal process transfers the tensile stress of the capping layer and introduces tensile strain into the source and drain regions of the first-type semiconductor region.

The thermal process can be any type of suitable process available in semiconductor processing to re-crystallize source and drain regions of the first-type semiconductor region. The thermal process can be an anneal performed at a temperature in a range from approximately 750° C. to approximately 1300° C. for a time period in a range from milliseconds to approximately 5 hours.

After the thermal process, the tensile stress capping layer is removed. Then, source and drain regions are formed in the second-type semiconductor region (stage 108). The source and drain region can be formed by an ion implantation. The ion implantation causes amorphization in the gate and source and drain region. The ion implantation may be performed using any suitable techniques available in semiconductor processing for ion implantation. For example, boron or other suitable P-type dopant may be implanted during the ion implantation process to form the source region and the drain region. Likewise, arsenic, phosphorous, antimony, or other suitable N-type dopant may be implanted.

During formation of the source and drain region of the second-type semiconductor region, the first-type semiconductor region is masked to prevent the formation of source and drain regions in the first-type semiconductor region.

Then, a compressive stress capping layer is formed over the second-type semiconductor region and the first-type semiconductor region (stage 110). The compressive stress capping layer can be any type of suitable compressive stress layer. For example, the compressive stress capping layer can be one or more nitride layers, one or more oxide layers, combination thereof, and the like.

After forming the compressive stress capping layer, a thermal process is performed (stage 112). The thermal process re-crystallizes the source and drain regions of the second-type semiconductor region. Additionally, the thermal process transfers the compressive stress of the capping layer and introduces compressive strain into the source and drain regions of the second-type semiconductor region.

The thermal process can be any type of suitable process available in semiconductor processing to re-crystallizes source and drain regions of the second-type semiconductor region. The thermal process can be an anneal performed at a temperature in a range from approximately 750° C. to approximately 1300° C. for a time period in a range from milliseconds to approximately 5 hours.

Afterwards, the compressive stress capping layer is removed (stage 114). Then, further processing can be preformed on the first-type and the second-type semiconductor regions. By utilizing separate capping layers and separate thermal processes for the different-type semiconductor regions, each device can be optimized without adversely affecting the other type region.

FIGS. 2A-2H are diagrams illustrating an exemplary method for forming source and drain regions for an NMOS and PMOS semiconductor regions. According to embodiments of the present disclosure, dual capping layers and split anneal processes are utilized to form the source and drain regions.

Figure 2A:
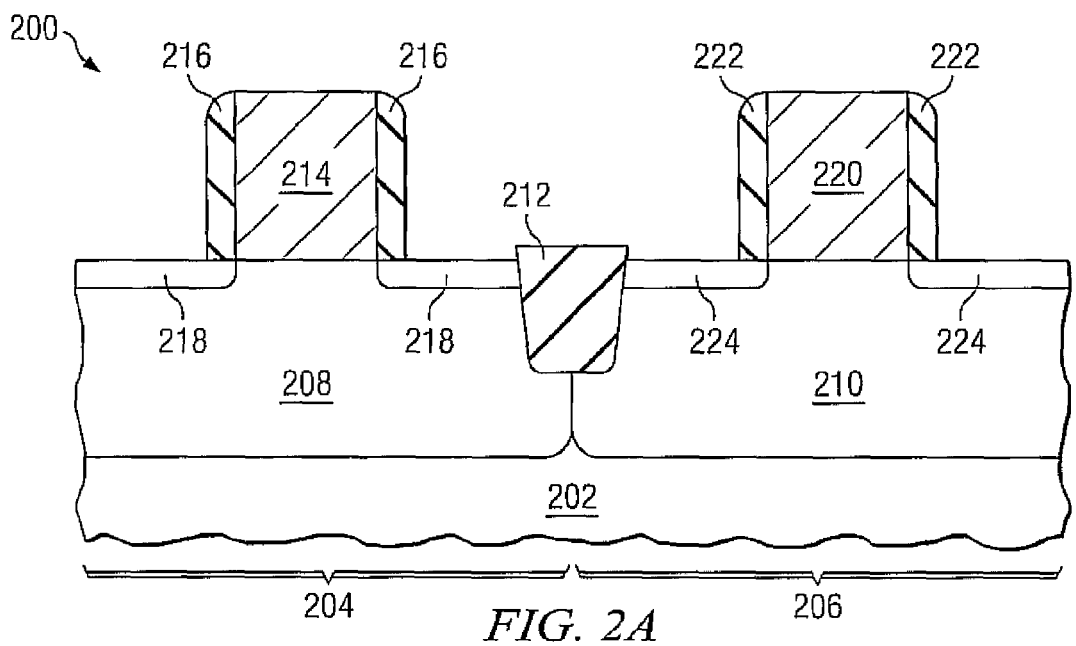
FIGS. 2A-2H are diagrams illustrating an exemplary method for forming source and drain regions in NMOS and PMOS devices consistent with embodiments of the present disclosure.

FIG. 2A shows a partially completed semiconductor device 200 including a partially completed NMOS semiconductor device and PMOS semiconductor device. As illustrated, device 200 includes a substrate 202, an NMOS region 204, and a PMOS region 206. Substrate 202 may be formed from any suitable semiconductor material, such as silicon. For example, substrate 202 may be a silicon wafer, a silicon wafer with previously embedded devices, an epitaxial layer grown on a wafer, a semiconductor on insulation ("SOI") system, or other suitable substrates having any suitable crystal orientation.

NMOS region 204 and PMOS region 206 can include various components of a partially completed semiconductor device such as a NMOS transistor and PMOS transistor, respectively. As illustrated, NMOS region 204 can include a P-well 208. PMOS region 206 can include an N-well 210. P-well 208 and N-well 210 can be formed utilizing any type of suitable technique used in semiconductor processing, such as doping.

NMOS region 204 and PMOS region 206 can be separated by an isolation feature 212. Isolation feature 212 can be formed of any suitable isolation structure such as shallow trench isolation (STI) regions, field oxide regions (LOCOS), and the like.

NMOS region 204 can include a gate 214 formed over P-well 208. Gate 214 can be formed of any well-known suitable materials by any suitable well-known techniques. For example, gate 214 can be formed using any suitable growth and/or deposition techniques using semiconductor processing and can be formed from any suitable material, such as polysilicon.

NMOS region 204 can include n-type extension regions 218. Extension regions 218 can be formed utilizing any suitable well-known techniques. For example, PMOS region 206 can be covered with a mask material and n-type dopants can be implanted in NMOS region 204.

Gate 214 can include sidewalls 216 formed on the side of gate 214. Sidewalls 216 can be formed of any well-known suitable materials by any suitable well-known techniques. For example, sidewalls 216 can be formed using any suitable growth and/or deposition techniques using semiconductor processing and can be formed from any suitable dielectric materials, such as oxide, nitride, a combination of oxide and nitride, or other suitable materials. FIG. 2A illustrates gate 214 with a pair of sidewalls 216 but one skilled in the art will realize that gate 214 can include additional sidewalls. Additionally, a gate oxide can be formed between gate 214 and substrate 202.

PMOS region 206 can include a gate 220 formed over N-well 210. Gate 220 can be formed of any well-known suitable materials by any suitable well-known techniques. For example, gate 220 can be formed using any suitable growth and/or deposition techniques using semiconductor processing and can be formed from any suitable material, such as polysilicon.

PMOS region 206 can include p-type extension regions 224. Extension regions 224 can be formed utilizing any suitable well-known techniques. For example, NMOS region 204 can be covered with a mask material and p-type dopants can be implanted in PMOS region 206.

Gate 220 can include sidewalls 222 formed on the side of gate 220. Sidewalls 222 can be formed of any well-known suitable materials by any suitable well-known techniques. For example, sidewalls 222 can be formed using any suitable growth and/or deposition techniques using semiconductor processing and can be formed from any suitable dielectric materials, such as oxide, nitride, a combination of oxide and nitride, or other suitable materials. FIG. 2A illustrates gate 220 with a pair of sidewalls 222 but one skilled in the art will realize that gate 220 can include additional sidewalls. Additionally, a gate oxide can be formed between gate 220 and substrate 202.

Figure 2B:
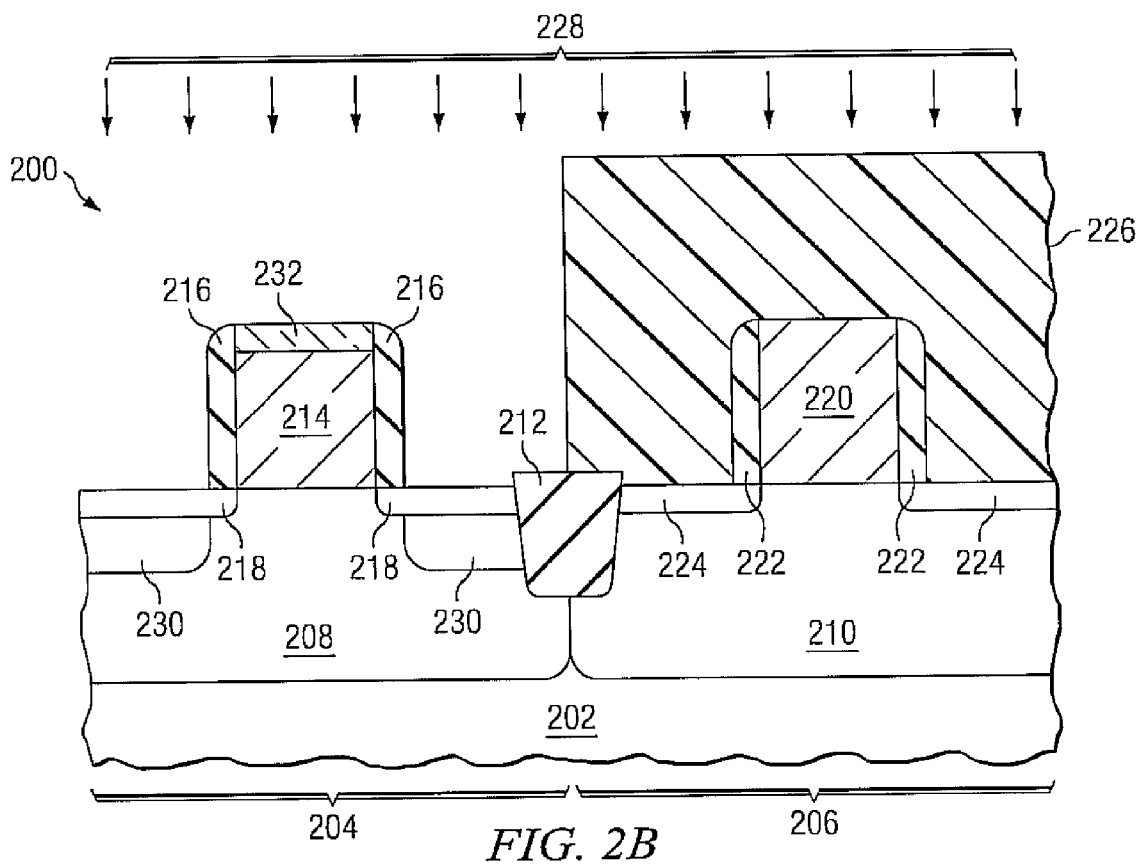

As illustrated in FIG. 2B, according to embodiments of the present disclosure, source and drain regions 230 are formed in NMOS region 204. Source and drain regions 230 can be formed in P-well 208 using any suitable techniques used in semiconductor processing, such as ion implantation.

Source and drain regions 230 can be formed by forming a resist mask 226 over PMOS region 206. Resist mask 226 can be formed over the entire substrate 202 and a portion may be removed to expose NMOS region 204. Resist mask 226 can be formed of any suitable material to block implantation of ions in PMOS region 206.

An ion implantation 228 is performed to form source and drain regions 230. For example, arsenic, phosphorous, antimony, or other suitable n-type dopants can be implanted in P-well 208 during ion implantation 228 to form source and drain regions 230. Additionally, during ion implantation, a doped region 232 may be formed at the top of gate 214.

Figure 2C:
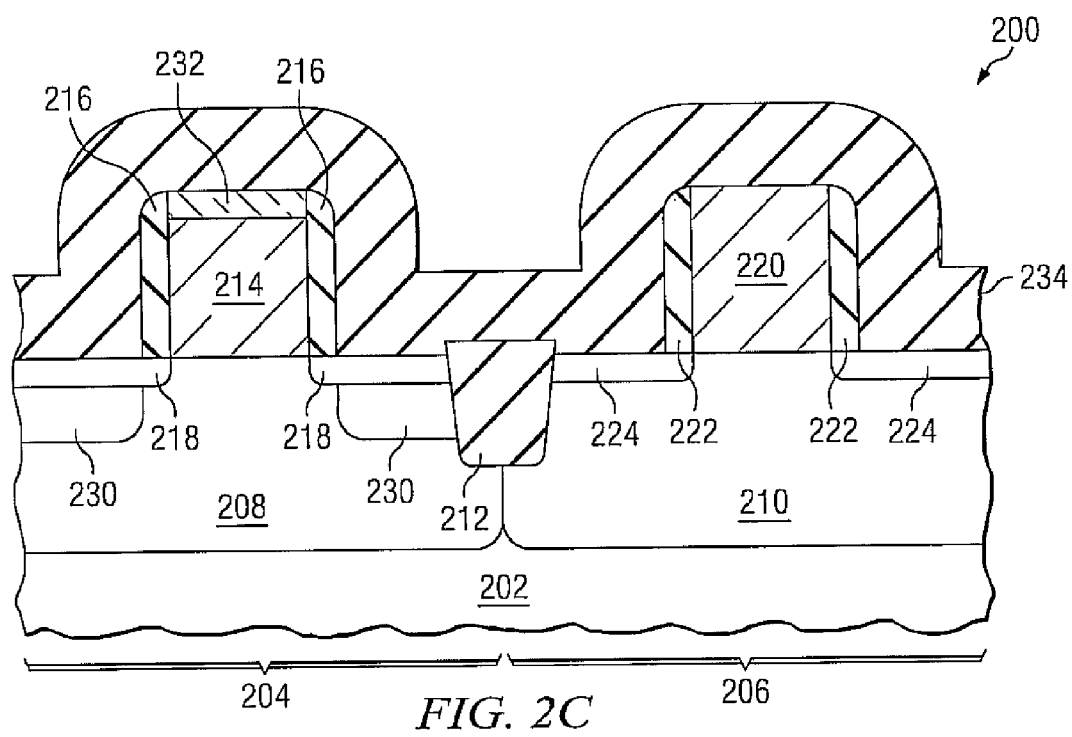

As illustrated in FIG. 2C, after forming source and drain regions 242, resist mask 226 is removed. Resist mask 226 can be removed utilizing any type of suitable technique available in semiconductor processing. For example, resist mask 226 can be removed utilizing an etch, an $O_2$ ashing, combination thereof, and the like.

Then, a capping layer 234 is formed over NMOS region 204 and PMOS region 206. Capping layer 234 can be a high tensile stress layer in order to introduce tensile strain into source and drain regions 230. Capping layer 234 can be any type of suitable tensile stress layer. For example, capping layer 234 can be one or more nitride layers, one or more oxide layers, combination thereof, and the like.

Capping layer 234 can be formed utilizing any type of well-known suitable technique available in semiconductor processing. For example, capping layer 234 can be formed using any suitable deposition techniques, such as chemical vapor deposition (CVD).

Figure 2D:
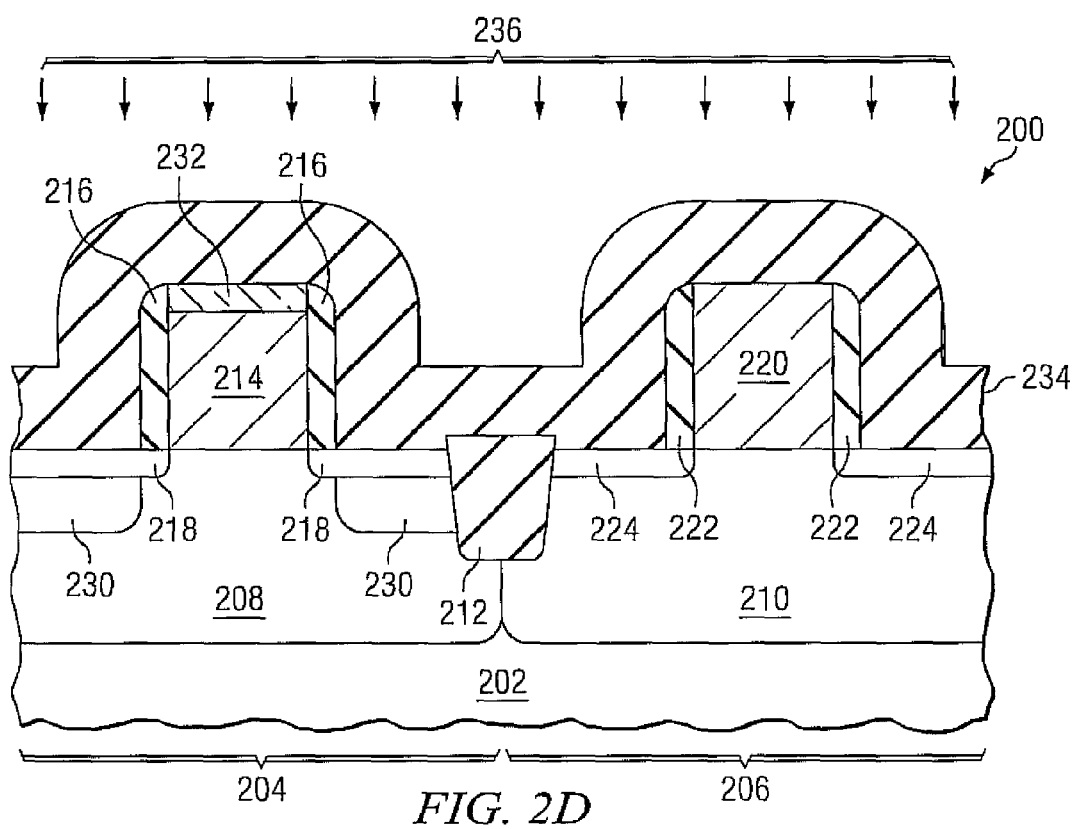

As illustrated in FIG. 2D, after forming capping layer 234, device 200 is subjected to a thermal process 236. Thermal process 236 re-crystallizes source and drain regions 230 and doped region 232, damaged during ion implantation 228. According to embodiments of the present disclosure, thermal process 236 transfers the tensile stress of capping layer 234 to source and drain region 230 and doped region 232 and introduces tensile stain into source and drain region 230 and doped region 232. Additionally, since PMOS region 206 does not include an amorphized gate, source and drain regions, PMOS region 206 is unaffected by the thermal process.

Thermal process 236 can be any type of suitable process available in semiconductor processing to re-crystallizes source and drain regions 230 and doped region 232. For example, thermal process 236 can be an anneal performed at a temperature in a range from approximately 750° C. to approximately 1300° C. for a time period in a range from milliseconds to approximately 5 hours.

Figure 2E:
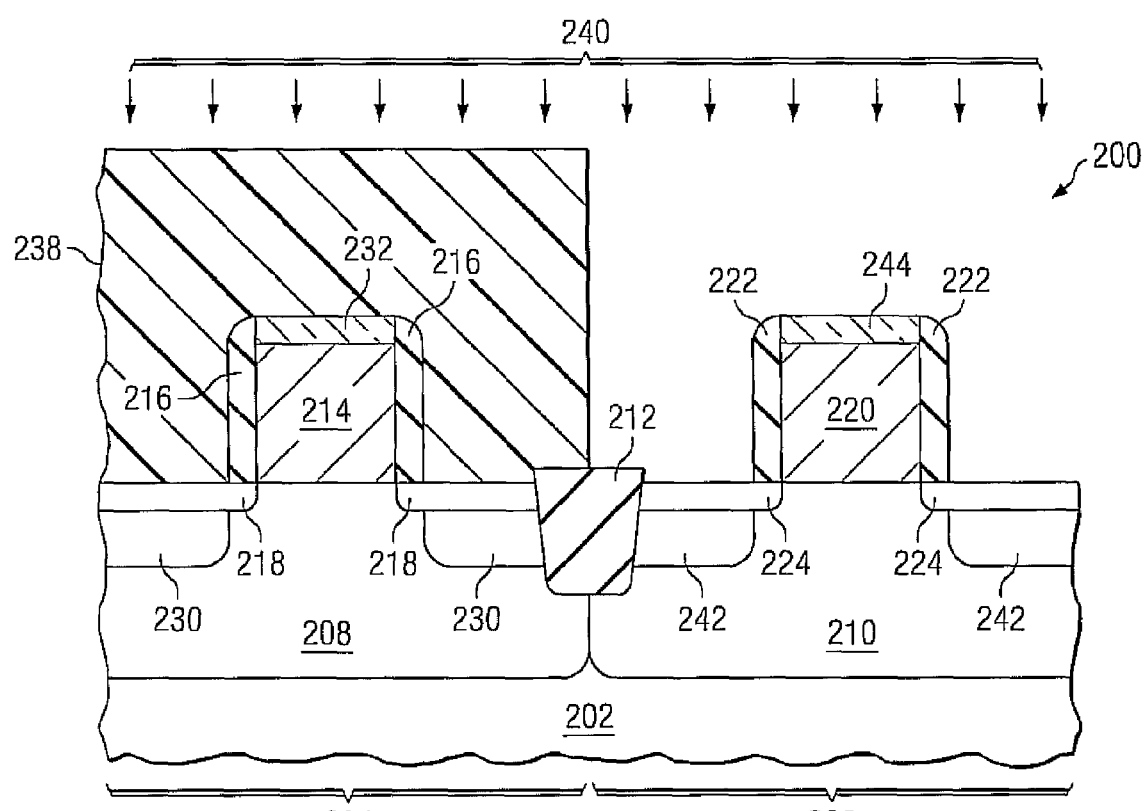

As illustrated in FIG. 2E, after thermal process 236, capping layer 234 is removed from device 200. Capping layer 234 can be removed utilizing any type of suitable technique available in semiconductor processing. For example, capping layer 234 can be removed utilizing an etch, chemical mechanical polish, combination thereof, and the like.

Then, source and drain regions 242 are formed in PMOS region 206. Source and drain regions 242 can be formed in N-well 210 using any suitable techniques available in semiconductor processing, such as ion implantation. Source and drain regions 242 can be formed by forming a resist mask 238 over NMOS region 204. Resist mask 238 can be formed over the entire substrate 202 and a portion may be removed to expose PMOS region 206. Resist mask 238 can be formed of any suitable material to block implantation of ions in NMOS region 204.

An ion implantation 240 is performed to form source and drain regions 242. For example, boron or other suitable P-type dopants can be implanted in N-well 210 during ion implantation 240 to form source and drain regions 242. Additionally, during ion implantation, a doped region 244 may be formed at the top of gate 220.

Figure 2F:
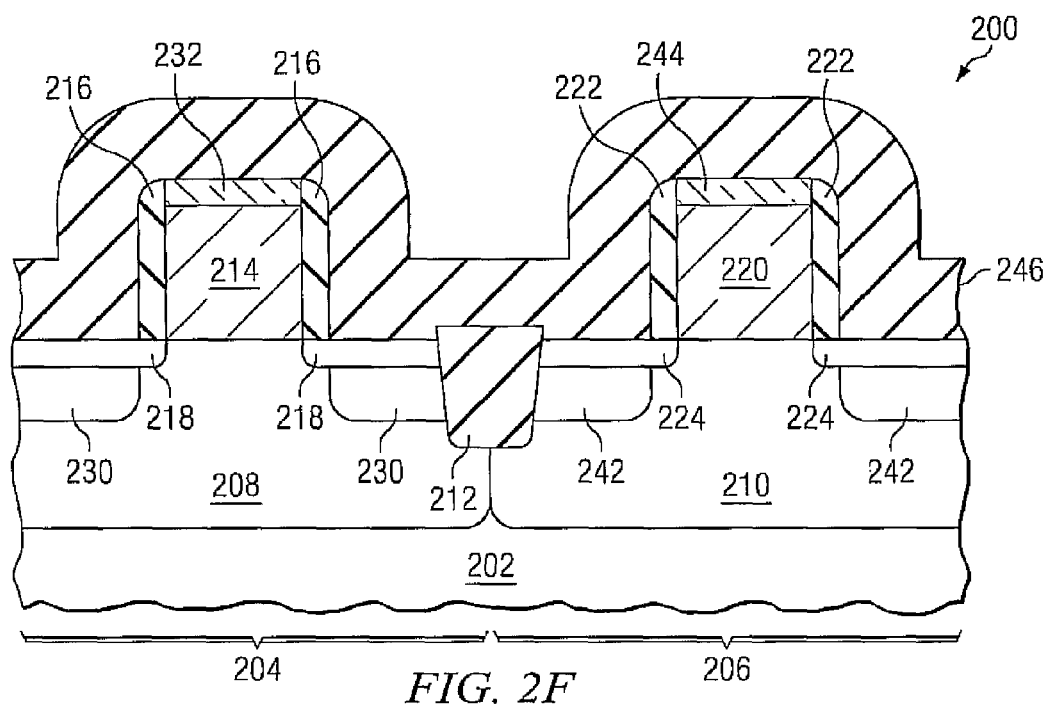

As illustrated in FIG. 2F, after forming source and drain regions 242, resist mask 238 is removed. Resist mask 238 can be removed utilizing any type of suitable technique available in semiconductor processing. For example, resist mask 238 can be removed utilizing an etch, an $O_2$ ashing, combination thereof and the like.

Then, a capping layer 246 is formed over NMOS region 204 and PMOS region 206. Accordingly to embodiments of the present disclosure, capping layer 246 can be a high compressive stress layer in order to introduce compressive strain into source and drain regions 242. Capping layer 246 can be any type of suitable compressive stress layer. For example, capping layer 246 can be one or more nitride layers, one or more oxide layers, combination thereof and the like.

Capping layer 246 can be formed utilizing any type of suitable technique available in semiconductor processing. For example, capping layer 246 can be formed using any deposition techniques, such as CVD.

Figure 2G:
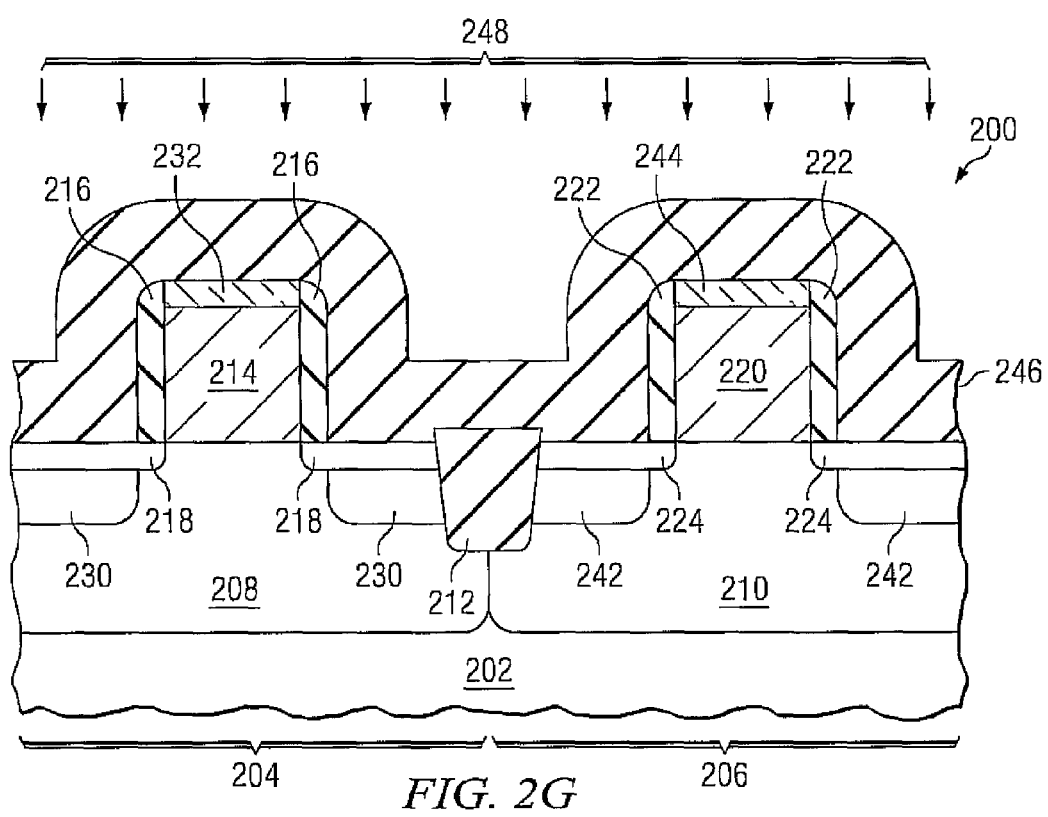

As illustrated in FIG. 2G, after forming capping layer 246, device 200 is subjected to a thermal process 248. Thermal process 248 re-crystallizes source and drain regions 242 and doped region 244, damaged during ion implantation 240. According to embodiments of the present disclose, thermal process 248 transfers the compressive stress of capping layer 246 to source and drain region 242 and doped region 244 and introduces compressive stain into source and drain region 242 and doped region 244. Additionally, NMOS region 204 is unaffected by thermal process 248 since source and drain regions 230 have been re-crystallized.

Thermal process 248 can be any type of suitable process available in semiconductor processing to re-crystallizes source and drain regions 242 and doped region 244. For example, thermal process 248 can be an anneal performed at a temperature in a range from approximately 750° C. to approximately 1300° C. for a time period in a range from milliseconds to approximately 5 hours.

Figure 2H:
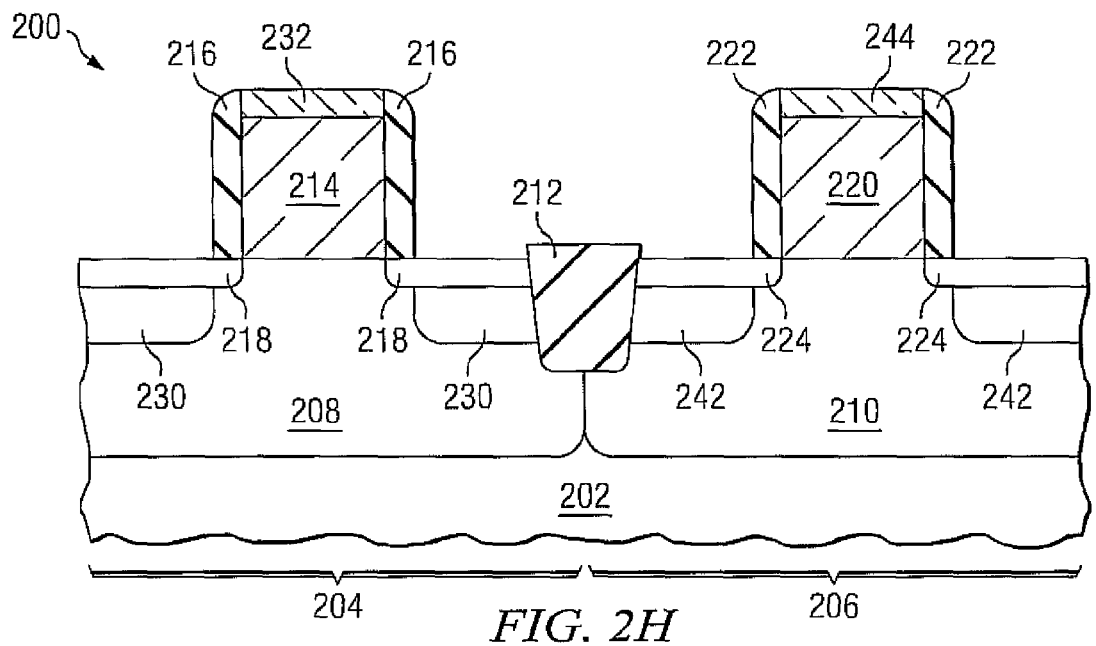

Afterwards, as illustrated in FIG. 2H, capping layer 246 is removed from device 200. Capping layer 246 can be removed utilizing any type of suitable technique available in semiconductor processing. For example, capping layer 246 can be removed utilizing an etch, chemical mechanical polish, combination thereof, and the like. After formation of source and drain regions 230 and 242 further semiconductor processing can be performed to complete device 200.

In embodiments of the present disclosure described above, device 200 includes an NMOS region and a PMOS region. One skilled in the art will realize that device 200 may include multiple NMOS regions, multiple PMOS regions, and other semiconductor features. As such, the method described above can be performed on the multiple NMOS regions and PMOS regions.

In the method described above, processing to re-crystallize doped region 232 and source and drain region 230 of NMOS region 204 is performed first. According to another embodiment of the present disclosure, processing to re-crystallize doped region 244 source and drain regions 242 can be performed prior to processing the NMOS device. In this embodiment, the stages illustrated in FIGS. 2E-2G can be performed prior to the stages illustrated in FIGS. 2B-2D.

In the method described above, both a capping layer 234 and a capping layer 246 are utilized. According to another embodiment of the present disclosure, only one capping layer can be utilized. In this embodiment, the method would be as illustrated in FIGS. 2A-2H with capping layer 234 and a capping layer 246 being omitted.

Figure 2I:
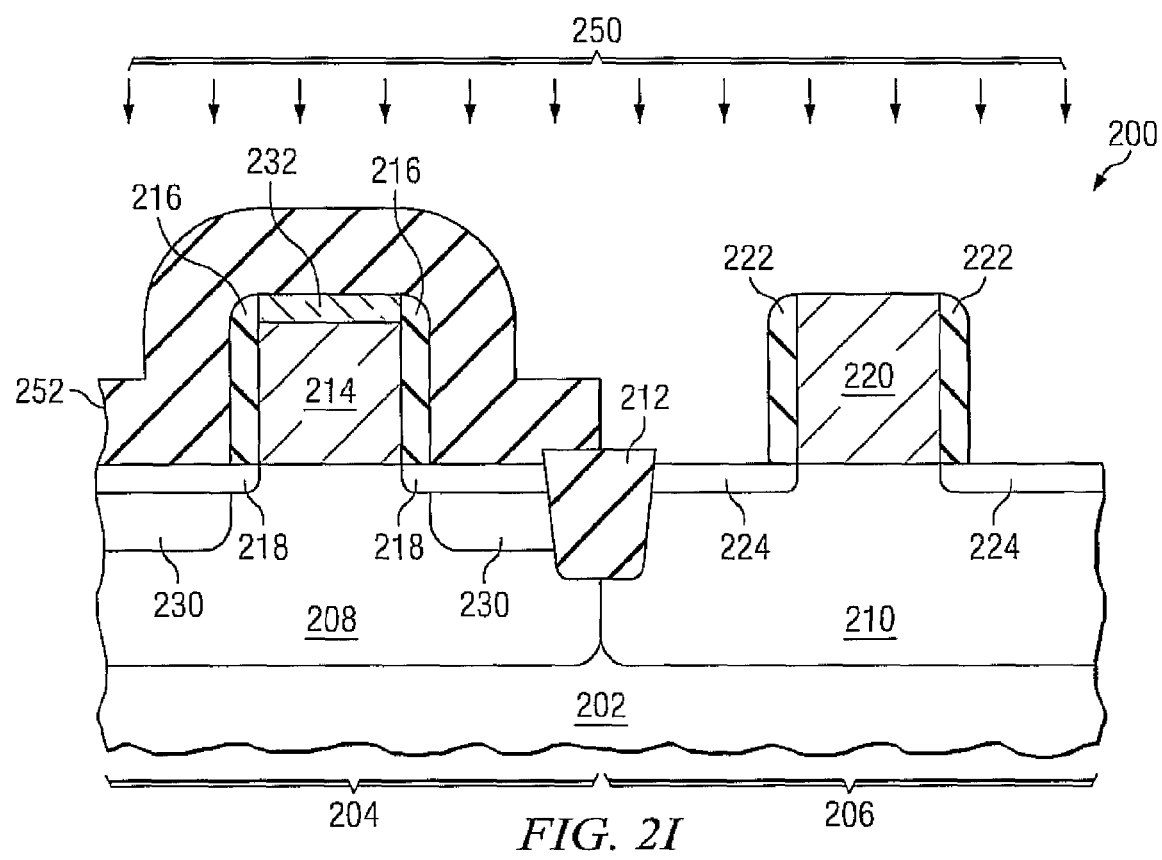
FIG. 2I is a diagram illustrating another exemplary method for forming source and drain regions in NMOS and PMOS devices consistent with other embodiments of the present disclosure.

According to another embodiment of the present disclosure, either capping layer 234 or capping layer 246 can be utilized as a resist mask in forming source and drain regions. FIG. 2I is a diagram illustrating using capping layer 234 as a resist mask in forming source and drain regions 242.

In this embodiment, a resist mask can be used to pattern capping layer 234 or capping layer 246 in order to selectively remove capping layer 234 or capping layer 246 from PMOS region 206 or NMOS region 204. As illustrated in FIG. 2I, after thermal process 236 FIG 2D, a portion of capping layer 234 can be removed to expose PMOS region 206. The portion of capping layer 246 can be removed utilizing any type of suitable technique available in semiconductor processing. For example, capping layer 246 can be patterned and removed utilizing an etch, such as an reactive ion etch. The remaining portion 252 of capping layer 234 would function during implantation 250 shown in FIG. 2I as implant mask 238 functions during implantation 240 shown in FIG 2E.

In addition, if processing on PMOS region 206 is performed first, a portion of capping layer 246 can be removed. As such, resist mask 226 can be omitted and the remaining portion of capping layer 246 can function as resist mask 226 in forming source and drain regions 230.

According to another embodiment of the present disclosure, a capping layer used to transfer tensile or compressive stress can be used to form sidewalls on gates of PMOS and NMOS devices. FIGS. 3A-3I are diagrams illustrating an exemplary method for forming source and drain regions for an NMOS and PMOS semiconductor regions consistent with embodiments of the present disclosure.

Figure 3A:
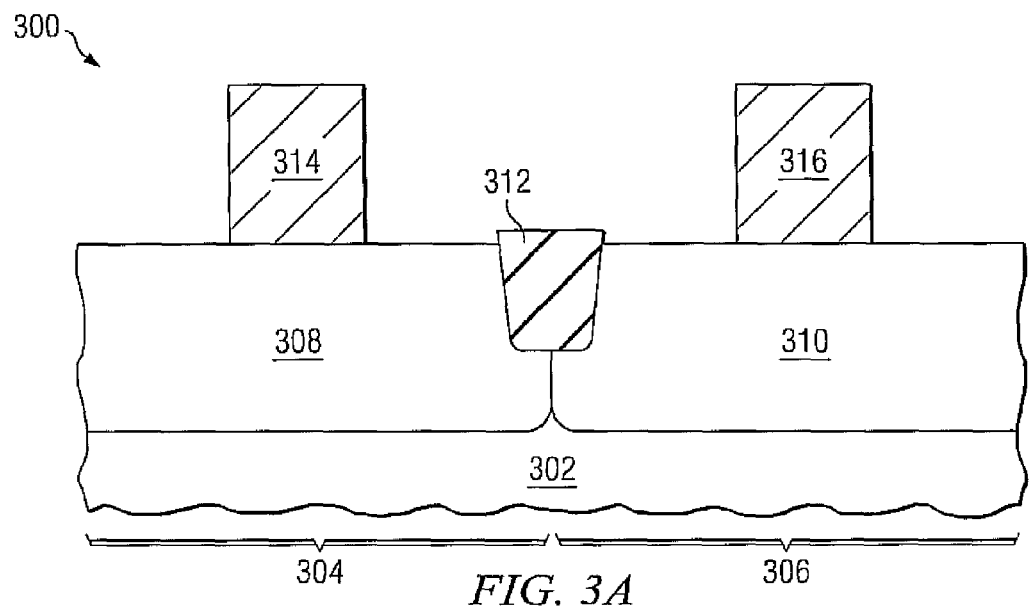
FIGS. 3A-3I are diagrams illustrating an exemplary method for sidewalls and forming source and drain regions in NMOS and PMOS devices consistent with other embodiments of the present disclosure.

FIG. 3A shows a partially completed semiconductor device 300 including a partially completed NMOS semiconductor device and PMOS semiconductor device. As illustrated, device 300 includes a substrate 302, an NMOS region 304, and a PMOS region 306. Substrate 302 may be formed from any suitable semiconductor material, such as silicon. For example, substrate 302 may be a silicon wafer, a silicon wafer with previously embedded devices, an epitaxial layer grown on a wafer, a SOI system, or other suitable substrates having any suitable crystal orientation.

NMOS region 304 and PMOS region 306 can include various components of a partially completed semiconductor device such as a NMOS transistor and PMOS transistor, respectively. As illustrated, NMOS region 304 can include a P-well 308. PMOS region 306 can include an N-well 310. P-well 308 and N-well 310 can be formed utilizing any type of suitable technique used in semiconductor processing, such as doping.

NMOS region 304 and PMOS region 306 can be separated by an isolation feature 312. Isolation feature 312 can be formed of any suitable isolation structure such as STI regions, LOCOS, and the like.

NMOS region 304 can include a gate 314 formed over P-well 308. Gate 314 can be formed of any well-known suitable materials by any suitable well-known techniques. For example, gate 314 can be formed using any suitable growth and/or deposition techniques using semiconductor processing and can be formed from any suitable material, such as polysilicon.

PMOS region 306 can include a gate 316 formed over N-well 310. Gate 316 can be formed of any well-known suitable materials by any suitable well-known techniques. For example, gate 316 can be formed using any suitable growth and/or deposition techniques using semiconductor processing and can be formed from any suitable material, such as polysilicon.

Figure 3B:
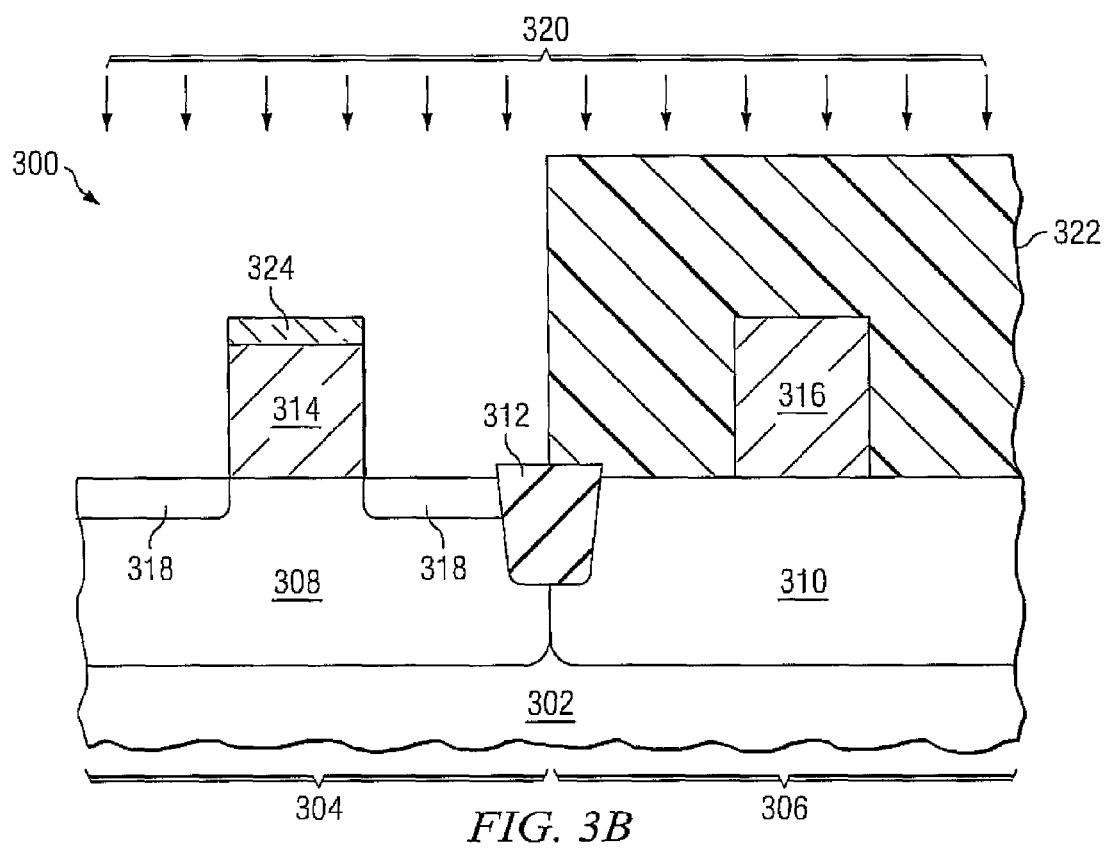

As illustrated in FIG. 3B, according to embodiments of the present disclosure, source and drain regions 318 are formed in NMOS region 304. Source and drain regions 318 can be formed in P-well 308 using any suitable techniques used in semiconductor processing, such as ion implantation 320.

Source and drain regions 318 can be formed by forming a resist mask 322 over PMOS region 306. Resist mask 322 can be formed over the entire substrate 302 and a portion may be removed to expose NMOS region 304. Resist mask 322 can be formed of any suitable material to block implantation of ions in PMOS region 306.

An ion implantation 320 is performed to form source and drain regions 318. For example, arsenic, phosphorous, antimony, or other suitable n-type dopants can be implanted in P-well 308 during ion implantation 320 to form source and drain regions 318. Additionally, during ion implantation, a doped region 324 can be formed at the top of gate 314. Ion implantation 320 causes the silicon of P-well 308 and gate 314 to amorphize.

Figure 3C:
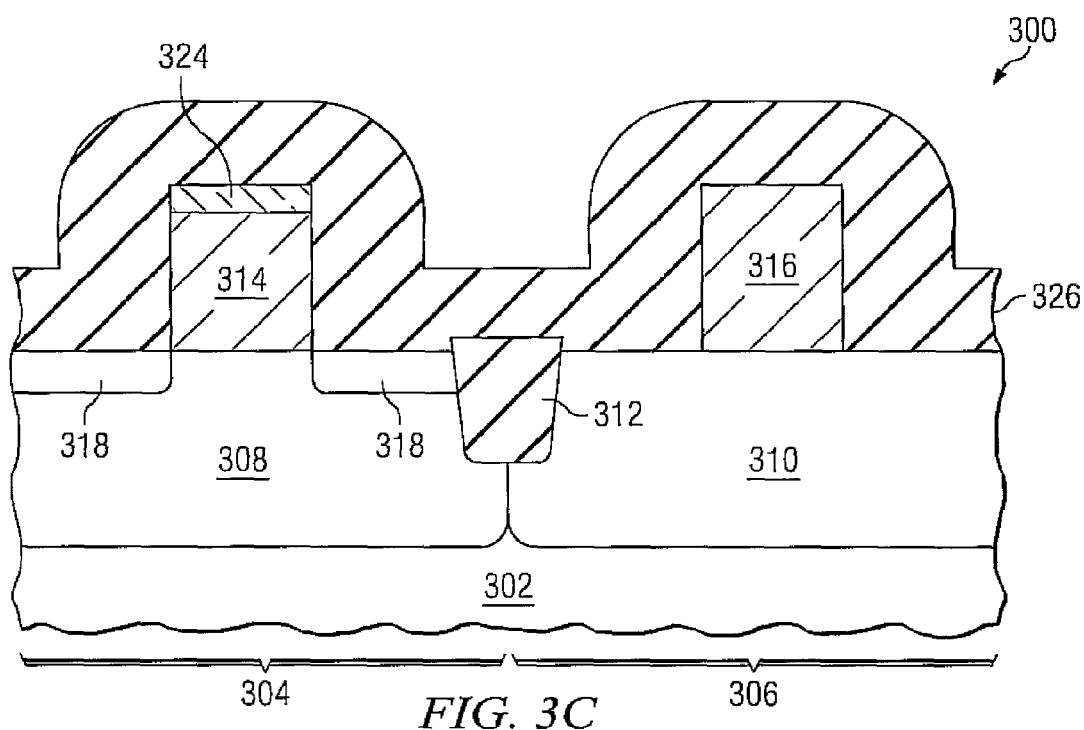

As illustrated in FIG. 3C, after forming source and drain regions 318, resist mask 322 is removed. Resist mask 322 can be removed utilizing any type of suitable technique available in semiconductor processing. For example, resist mask 322 can be removed utilizing an etch, an $O_2$ ashing, combination thereof, and the like.

Then, a capping layer 326 is formed over NMOS region 304 and PMOS region 306. Capping layer 326 can be a high tensile stress layer in order to introduce tensile strain into source and drain regions 318 and doped region 324. Capping layer 326 can be any type of suitable tensile stress layer. For example, capping layer 326 can be one or more nitride layers, one or more oxide layers, combination thereof, and the like.

Capping layer 326 can be formed utilizing any type of well-known suitable technique available in semiconductor processing. For example, capping layer 326 can be formed using any suitable deposition techniques, such as CVD.

Figure 3D:
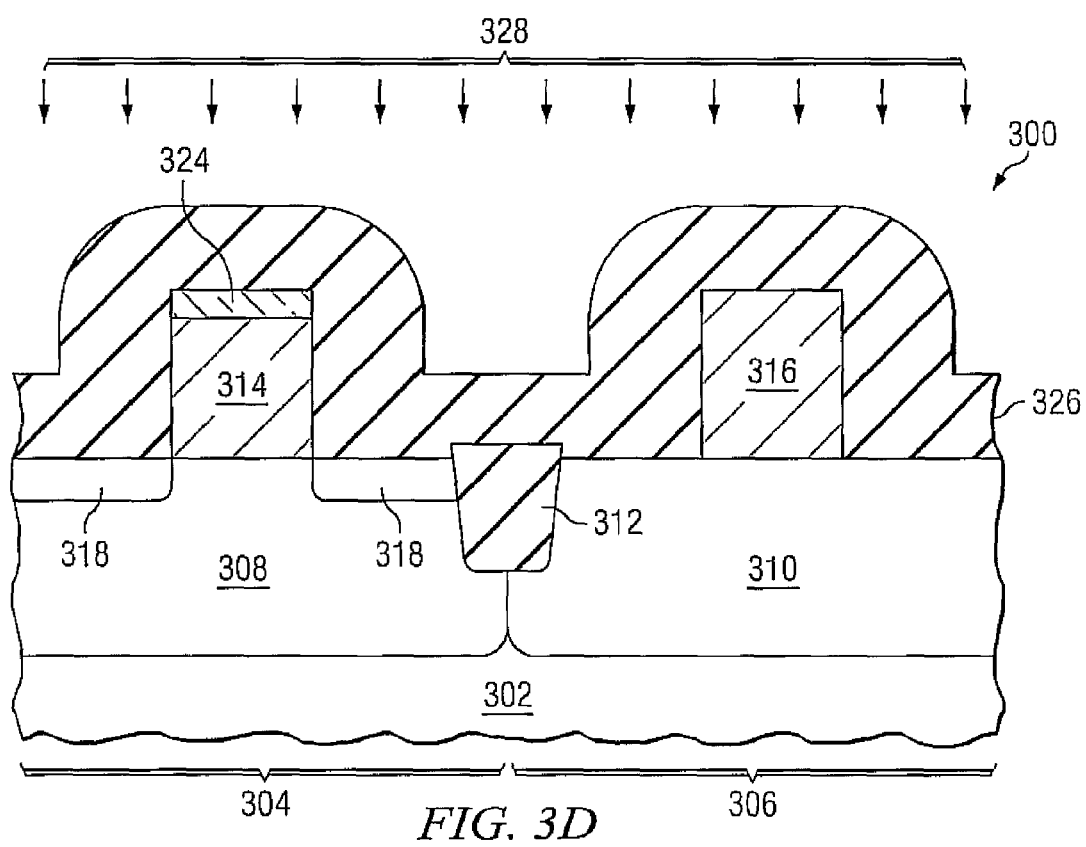

As illustrated in FIG. 3D, after forming capping layer 326, device 300 is subjected to a thermal process 328. Thermal process 328 re-crystallizes source and drain regions 318 and doped region 324, damaged during ion implantation 320. According to embodiments of the present disclose, thermal process 328 transfers the tensile stress of capping layer 326 to source and drain region 318 and doped region 324 and introduces tensile stain into source and drain region 318 and doped region 324. Additionally, since PMOS region 306 does not include an amorphized gate, source and drain regions, PMOS region 306 is unaffected by the thermal process.

Thermal process 328 can be any type of suitable process available in semiconductor processing to re-crystallizes source and drain regions 318 and doped region 324. For example, thermal process 328 can be an anneal performed at a temperature in a range from approximately 750° C. to approximately 1300° C. for a time period in a range from milliseconds to approximately 5 hours.

Figure 3E:
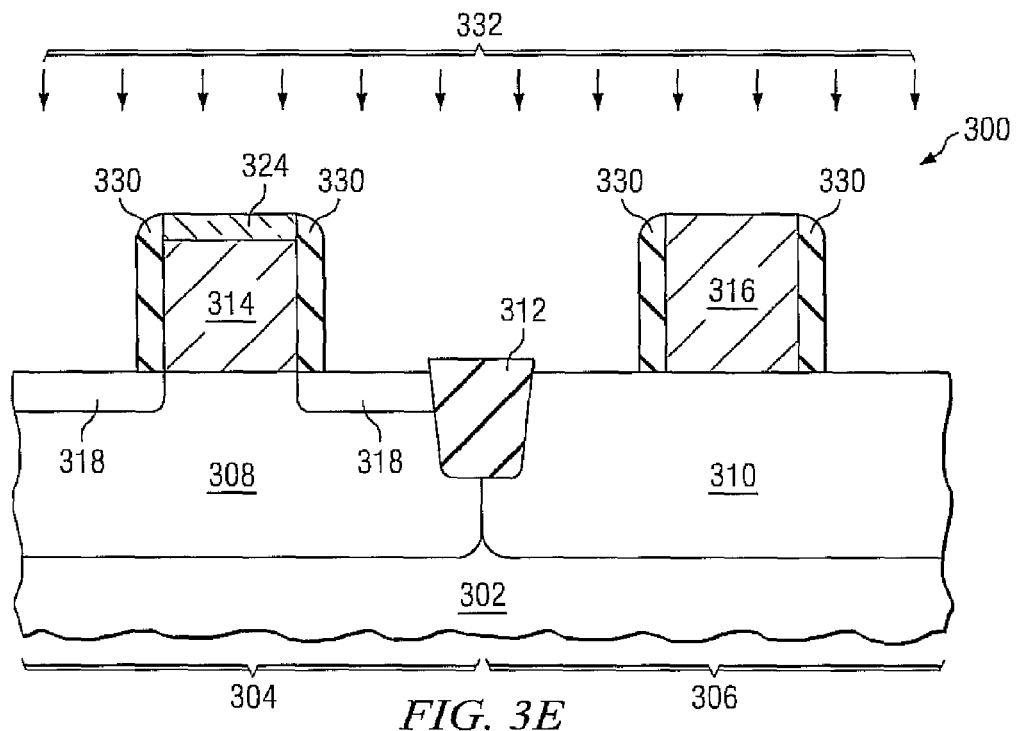

As illustrated in FIG. 3E, according to embodiments of the present disclosure, after thermal process 328, portions of capping layer 326 are removed. Portions of capping layer 326 are removed to form sidewalls 330 on gate 314 and gate 316. Capping layer 326 can be removed utilizing any type of suitable technique available in semiconductor processing. For example, capping layer 234 can be removed utilizing an etch 332, such as a dry etch.

Figure 3F:
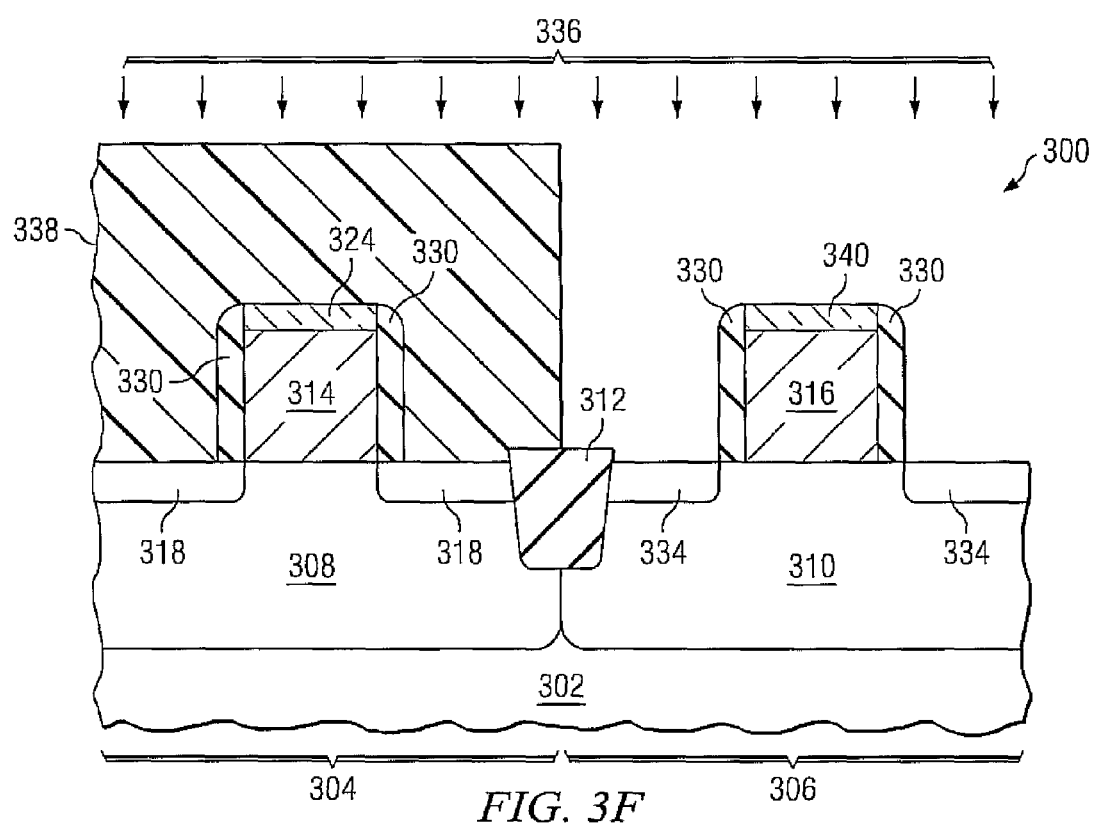

Then, as illustrated in FIG. 3F, source and drain regions 334 are formed in PMOS region 306. Source and drain regions 334 can be formed in N-well 310 using any suitable techniques available in semiconductor processing, such an ion implantation 336. Source and drain regions 334 can be formed by forming a resist mask 338 over NMOS region 304. Resist mask 338 can be formed over the entire substrate 302 and a portion may be removed to expose PMOS region 306. Resist mask 338 can be formed of any suitable material to block implantation of ions in NMOS region 304.

An ion implantation 336 is performed to form source and drain region 334. For example, boron or other suitable P-type dopants can be implanted in N-well 310 during ion implantation 336 to form source and drain regions 334. Additionally, during ion implantation, a doped region 340 may be formed at the top of gate 316.

Figure 3G:
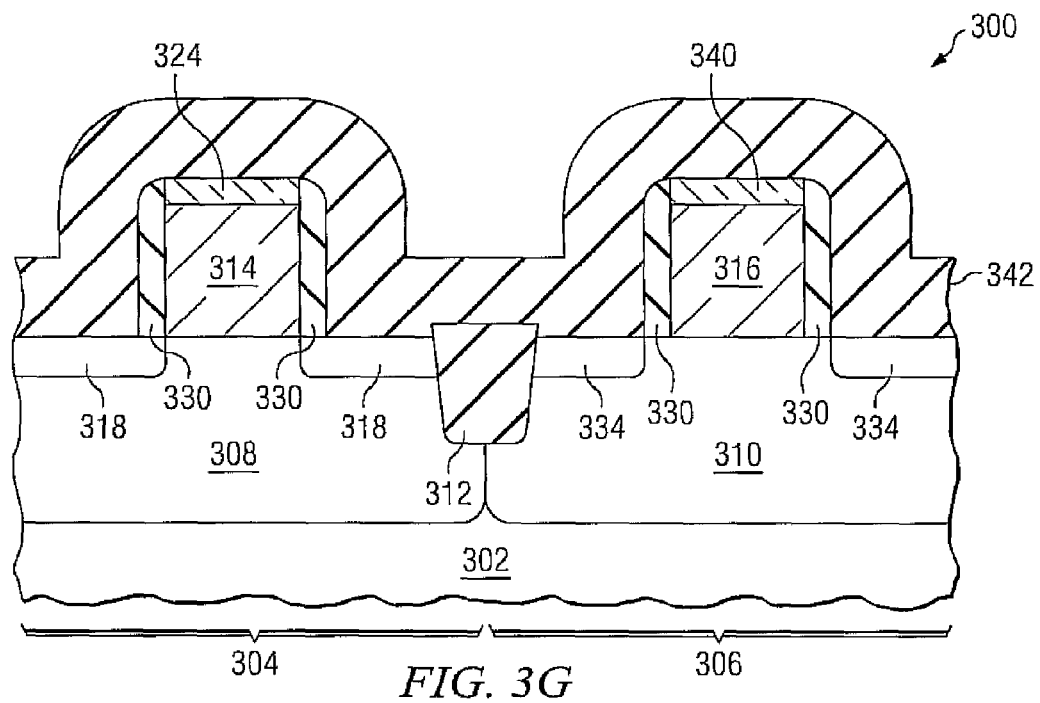

As illustrated in FIG. 3G, after forming source and drain regions 334, resist mask 338 is removed. Resist mask 338 can be removed utilizing any type of suitable technique available in semiconductor processing. For example, resist mask 338 can be removed utilizing an etch, an $O_2$ ashing, combination thereof, and the like.

Then, a capping layer 342 is formed over NMOS region 304 and PMOS region 306. Accordingly to embodiments of the present disclosure, capping layer 342 can be a high compressive stress layer in order to introduce compressive strain into source and drain regions 334 and doped region 340. Capping layer 342 can be any type of suitable compressive stress layer. For example, capping layer 342 can be one or more nitride layers, one or more oxide layers, combination thereof, and the like.

Capping layer 342 can be formed utilizing any type of suitable technique available in semiconductor processing. For example, capping layer 342 can be formed using any suitable deposition techniques, such as CVD.

Figure 3H:
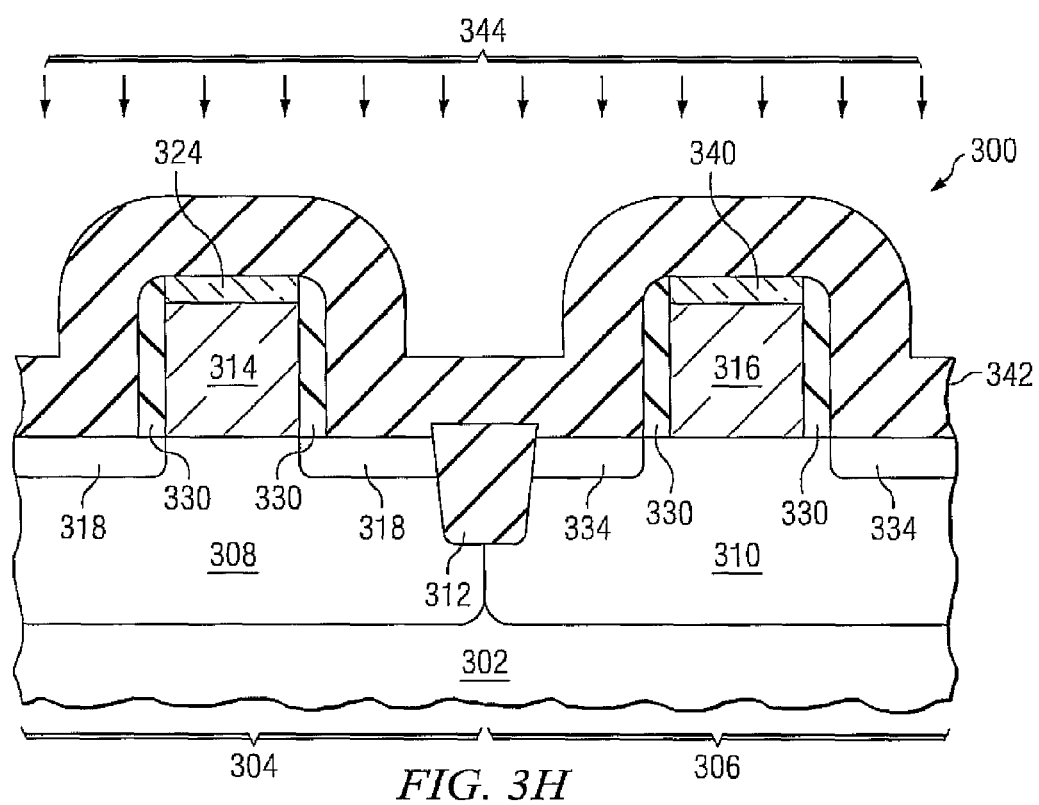

As illustrated in FIG. 3H, after forming capping layer 342, device 300 is subjected to a thermal process 344. Thermal process 344 re-crystallizes source and drain regions 334 and doped region 340, damaged during ion implantation 336. According to embodiments of the present disclose, thermal process 344 transfers the compressive stress of capping layer 342 to source and drain region 334 and doped region 340 and introduces compressive stain into source and drain region 334 and doped region 340. Additionally, NMOS region 304 is unaffected by thermal process 344 since source and drain regions 318 and doped region 324 have been re-crystallized.

Thermal process 344 can be any type of suitable process available in semiconductor processing to re-crystallizes source and drain regions 334 and doped region 340. For example, thermal process 344 can be an anneal performed at a temperature in a range from approximately 750° C. to approximately 1300° C. for a time period in a range from milliseconds to approximately 5 hours.

Figure 3I:
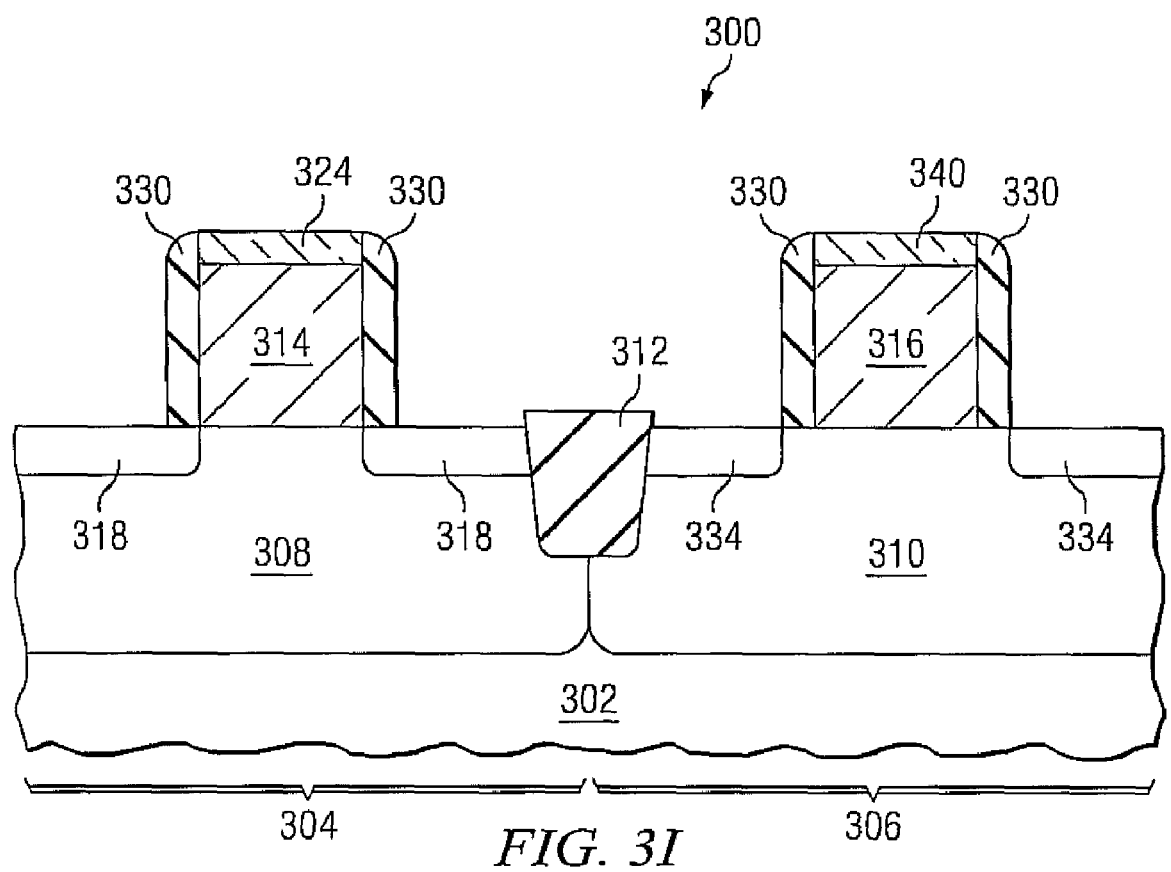

Afterwards, as illustrated in FIG. 3I, capping layer 342 is removed from device 300. Capping layer 342 can be removed utilizing any type of suitable technique available in semiconductor processing. For example, capping layer 342 can be removed utilizing an etch, chemical mechanical polish, combination thereof, and the like. After formation of source and drain regions 318 and 334 further semiconductor processing can be performed to complete device 300.

In embodiments of the present disclosure described above, device 300 includes an NMOS region and a PMOS region. One skilled in the art will realize that device 300 may include multiple NMOS regions, multiple PMOS regions, and other semiconductor features. As such, the method described above can be performed on the multiple NMOS regions and PMOS regions.

In the method described above, processing to form and to re-crystallize doped region 324 and source and drain region 318 of NMOS region 304 is performed first. According to another embodiment of the present disclosure, the source and drain regions of the PMOS region may be formed first, prior to processing the NMOS region. In this embodiment, processing to form and re-crystallize doped region 340 and source and drain regions 334 can be performed prior to processing the NMOS device. In this embodiment, the stages illustrated in FIGS. 3F-3I can be performed prior to the stages illustrated in FIGS. 3B-3E with capping layer 342 being utilized to from sidewalls 330.

In the method described above, both a capping layer 326 and a capping layer 342 are utilized. According to another embodiment of the present disclosure, only one capping layer can be utilized. In this embodiment, the method would be as illustrated in FIGS. 3A-3I with capping layer 326 and a capping layer 342 being omitted.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a semiconductor device, comprising:
   providing a substrate having a first-type semiconductor device region and a second-type semiconductor device region;
   forming first source and drain regions in the first-type semiconductor device region with the second-type semiconductor device region masked;
   forming a first capping layer comprising one of a tensile stress or compressive stress capping layer over the first-type semiconductor device region and over the second-type semiconductor device region;
   performing a first thermal process to re-crystallize the first source and drain regions and to introduce a corresponding one of tensile strain or compressive strain by transfer of stress from the first capping layer into the first source and drain regions;
   after said first thermal process, forming second source and drain regions in the second-type semiconductor device region with the first-type semiconductor device region masked;
   forming a second capping layer comprising the other of the tensile stress or compressive stress capping layer over the first-type semiconductor device region and over the second-type semiconductor device region; and
   performing a second thermal process to re-crystallize the second source and drain regions and to introduce a corresponding other of the tensile strain or compressive strain by transfer of stress from the second capping layer into the second source and drain regions.

2. The method of claim 1, wherein at least one of the first or second thermal processes comprises performing an anneal at a temperature of approximately 750° C. to approximately 1300° C. for a time period from milliseconds to approximately 5 hours.

3. The method of claim 1, wherein at least one of the first and second capping layers comprises a nitride layer.

4. The method of claim 1, further comprising removing the first capping layer after the first thermal process and prior to forming the second source and drain regions.

5. The method of claim 4, further comprising removing the second capping layer.

6. The method of claim 1, further comprising removing a portion of the first capping layer over the second-type semiconductor device region, wherein a remaining portion of the first capping layer is utilized to mask the first-type semiconductor device region in forming the second source and drain regions.

7. The method of claim 1, wherein the first-type semiconductor device region is an NMOS transistor device region; the second-type semiconductor device region is a PMOS transistor device region; the first capping layer is a tensile stress capping layer; the second capping layer is a compressive stress capping layer; the first thermal process introduces a tensile strain into the first source and drain regions; and the second thermal process introduces a compressive strain into the second source and drain regions.

8. The method of claim 1, wherein the first-type semiconductor device region and the second-type semiconductor device region are MOS transistor device regions and include respective gates with sidewalls formed over well regions.

9. The method of claim 8, wherein at least one of the first and second capping layers is utilized to form sidewalls adjacent a gate formed in at least one of the first-type and second-type semiconductor device regions.

10. The method of claim 8, wherein the first and second source and drain regions are formed by implanting dopants; implanting the dopants also forms first and second doped gate regions in the respective gates; and the first and second thermal processes also re-crystallize the respective doped gate regions and introduce the corresponding one or the other tensile or compressive strain into the first and second doped gate regions.

11. A method of fabricating a semiconductor device, comprising:
    providing a substrate having a first-type semiconductor device region and a second-type semiconductor device region;
    forming first source and drain regions in the first-type semiconductor device region with the second-type semiconductor device region masked;
    forming a first capping layer comprising one of a tensile stress or compressive stress capping layer over the first-type semiconductor device region and over the second-type semiconductor device region;
    performing a first thermal process to re-crystallize the first source and drain regions and to introduce a corresponding one of tensile strain or compressive strain by transfer of stress from the first capping layer into the first source and drain regions;
    removing a portion of the first capping layer over the second-type semiconductor device region, wherein a remaining portion of the first capping layer is utilized to mask the first-type semiconductor device region; and
    forming second source and drain regions in the second-type semiconductor device region after said first thermal process with the first-type semiconductor device region masked by the remaining portion of the first capping layer.

12. The method of claim 11, wherein the first-type semiconductor device region is an NMOS transistor device region; the second-type semiconductor device region is a PMOS transistor device region; the first capping layer is a tensile stress capping layer; and the first thermal process introduces a tensile strain into the first source and drain regions.

13. The method of claim 11, wherein the first-type semiconductor device region and the second-type semiconductor device region are MOS transistor device regions and include respective gates with sidewalls formed over well regions.

14. A method of fabricating a semiconductor device, comprising:
    providing a substrate having a first-type semiconductor device region and a second-type semiconductor device region;
    forming first source and drain regions in the first-type semiconductor device region with the second-type semiconductor device region masked;
    forming a first capping layer comprising one of a tensile stress or compressive stress capping layer over the first-type semiconductor device region and over the second-type semiconductor device region;
    performing a first thermal process to re-crystallize the first source and drain regions and to introduce a corresponding one of tensile strain or compressive strain by transfer of stress from the first capping layer into the first source and drain regions;
    removing portions of the first capping layer to form sidewalls on at least one gate of the at least one of the first-type and second-type semiconductor device regions;
    after said first thermal process, forming second source and drain regions in the second-type semiconductor device region;
    forming a second capping layer comprising the other of the tensile stress or compressive stress capping layer over the first-type semiconductor device region and over the second-type semiconductor device region; and
    performing a second thermal process to re-crystallize the second source and drain regions and to introduce a corresponding other of the tensile strain or compressive strain by transfer of stress from the second capping layer into the second source and drain regions.

15. The method of claim 14, wherein at least one of the first or second thermal processes comprises performing an anneal at a temperature of approximately 750° C. to approximately 1300° C. for a time period from milliseconds to approximately 5 hours.

16. The method of claim 14, wherein at least one of the first and second capping layers comprises a nitride layer.

17. The method of claim 14, wherein removing portions of the first capping layer comprises performing a dry etch.

18. The method of claim 14, wherein the first thermal process comprises performing an anneal at a temperature of approximately 750° C. to approximately 1300° C. for a time period from milliseconds to approximately 5 hours.

19. The method of claim 14, wherein the first capping layer comprises a nitride layer.

20. The method of claim 14, further comprising removing the second capping layer.

21. The method of claim 14, wherein removing portion of the first capping layer, comprises removing portions of the first capping layer over the second-type semiconductor device region, wherein remaining portions of the first capping layer are utilized to mask the first-type semiconductor device region in forming the second source and drain regions.

22. The method of claim 14, wherein the first-type semiconductor device region is an NMOS transistor device region; the second-type semiconductor device region is a PMOS transistor device region; the first capping layer is a tensile stress capping layer; the second capping layer is a compressive stress capping layer; the first thermal process introduces a tensile strain into the first source and drain regions; and the second thermal process introduces a compressive strain into the second source and drain regions.

23. A method of fabricating a semiconductor device, comprising:
    providing a substrate having a first-type semiconductor device region and a second-type semiconductor device region;
    forming first source and drain regions in the first-type semiconductor device region with the second-type semiconductor device region masked;
    forming a first capping layer comprising one of a tensile stress or compressive stress capping layer over the first-type semiconductor device region and over the second-type semiconductor device region;
    performing a first thermal process to re-crystallize the first source and drain regions and to introduce a corresponding one of tensile strain or compressive strain by transfer of stress from the first capping layer into the first source and drain regions;

removing portions of the first capping layer to form sidewalls on at least one gate of the at least one of the first-type and second-type semiconductor device regions; and forming second source and drain regions in the second-type semiconductor device region after said first thermal process;

wherein removing portions of the first capping layer comprises removing portions of the first capping layer over the second-type semiconductor device region, wherein remaining portions of the first capping layer are utilized to mask the first-type semiconductor device region in forming the second source and drain regions.

24. A method of fabricating a semiconductor device, comprising:

providing a substrate having a first-type semiconductor device region and a second-type semiconductor device region;

forming first source and drain regions in the first-type semiconductor device region with the second-type semiconductor device region masked;

forming a first capping layer comprising one of a tensile stress or compressive stress capping layer over the first-type semiconductor device region and over the second-type semiconductor device region;

performing a first thermal process to re-crystallize the first source and drain regions and to introduce a corresponding one of tensile strain or compressive strain by transfer of stress from the first capping layer into the first source and drain regions;

removing at least portions of the first capping layer after the first thermal process; and forming second source and drain regions in the second-type semiconductor device region after said first thermal process with the first-type semiconductor device region masked by other portions of the first capping layer.

25. A method of fabricating a semiconductor device, comprising:

providing a substrate having a first-type semiconductor device region and a second-type semiconductor device region with gates formed thereon;

forming first source and drain regions in the first-type semiconductor device region with the second-type semiconductor device region masked;

forming a first capping layer comprising one of a tensile stress or compressive stress capping layer over the first-type semiconductor device region and over the second-type semiconductor device region;

performing a first thermal process to re-crystallize the first source and drain regions and to introduce a corresponding one of tensile strain or compressive strain by transfer of stress from the first capping layer into the first source and drain regions;

removing portions of the first capping layer after the first thermal process to form sidewalls on the gates;

after removing portions of the first capping layer, forming second source and drain regions in the second-type semiconductor device region with the first-type semiconductor device region masked;

forming a second capping layer comprising the other of a tensile stress or a compressive stress capping layer over the first-type semiconductor device region and over the second-type semiconductor device region; and performing a second thermal process to re-crystallize the second source and drain regions and to introduce a corresponding other one of tensile strain and compressive strain by transfer of stress from the second capping layer into the formed second source and drain regions.

26. The method of claim 25, wherein the first-type semiconductor device region is an NMOS transistor device region; the second-type semiconductor device region is a PMOS transistor device region; the first capping layer is a tensile stress capping layer; the second capping layer is a compressive stress capping layer; the first thermal process introduces a tensile strain into the first source and drain regions; and the second thermal process introduces a compressive strain into the second source and drain regions.

27. A method of fabricating a semiconductor device, comprising:

providing a substrate having an NMOS transistor region and a PMOS transistor region;

forming first source and drain regions in the NMOS transistor region with the PMOS transistor region masked;

forming a first capping layer comprising a tensile stress capping layer over the NMOS transistor region and over the PMOS transistor region;

performing a first thermal anneal to re-crystallize the first source and drain regions and to introduce a tensile strain by transfer of stress from the first capping layer into the first source and drain regions;

removing at least a portion of the first capping layer after the first anneal;

after removing the at least a portion of the first capping layer, forming second source and drain regions in the PMOS transistor region with the NMOS transistor region masked;

forming a second capping layer comprising a compressive stress capping layer over the NMOS transistor region and over the PMOS transistor region; and performing a second thermal anneal to re-crystallize the second source and drain regions and to introduce a compressive strain by transfer of stress from the second capping layer into the second source and drain regions.

28. The method of claim 27, wherein removing at least a portion of the first capping layer comprises forming sidewalls on a transistor gate in at least one of the NMOS and PMOS transistor regions.

* * * * *